(12) United States Patent
Werner et al.

(10) Patent No.: US 11,936,161 B2
(45) Date of Patent: Mar. 19, 2024

(54) LASER PROJECTOR WITH TWO LASER DIODES

(71) Applicant: LAP GmbH Laser Applikationen, Lüneburg (DE)

(72) Inventors: Hans-Peter Werner, Lüneburg (DE); Matthias Lange, Dalldorf (DE); Tze Keong Chow, Singapore (SG)

(73) Assignee: LAP GmbH Laser Applikationen, Lüneburg (DE)

( * ) Notice: Subject to any disclaimer, the term of this patent is extended or adjusted under 35 U.S.C. 154(b) by 470 days.

(21) Appl. No.: 17/358,127

(22) Filed: Jun. 25, 2021

(65) Prior Publication Data

US 2021/0408763 A1   Dec. 30, 2021

(30) Foreign Application Priority Data

Jun. 26, 2020   (DE) .......................... 10 2020 116 897

(51) Int. Cl.
| | |
|---|---|
| *H01S 5/0683* | (2006.01) |
| *G02B 27/28* | (2006.01) |
| *H01S 5/02255* | (2021.01) |
| *H01S 5/02315* | (2021.01) |
| *H01S 5/042* | (2006.01) |
| *H01S 5/40* | (2006.01) |

(52) U.S. Cl.
CPC .......... *H01S 5/0683* (2013.01); *G02B 27/283* (2013.01); *H01S 5/02255* (2021.01); *H01S 5/02315* (2021.01); *H01S 5/0428* (2013.01); *H01S 5/4012* (2013.01)

(58) Field of Classification Search
USPC .................................................... 372/29.011
See application file for complete search history.

(56) References Cited

U.S. PATENT DOCUMENTS

| | | |
|---|---|---|
| 2008/0204664 A1 | 8/2008 | Zimmermann |
| 2010/0231864 A1 | 9/2010 | Shibasaki et al. |
| 2014/0240952 A1* | 8/2014 | Nakanishi ........... H01S 5/02253 |
| | | 29/25.01 |
| 2014/0340585 A1 | 11/2014 | Heinzelmann et al. |

(Continued)

FOREIGN PATENT DOCUMENTS

| | | |
|---|---|---|
| DE | 102008010407 A1 | 8/2008 |
| DE | 102010002745 A1 | 9/2010 |

(Continued)

*Primary Examiner* — Tuan N Nguyen
(74) *Attorney, Agent, or Firm* — Barclay Damon LLP

(57) ABSTRACT

A device for laser projection comprises a first laser diode configured to emit a first linearly polarized laser beam extending along a first polarization axis and a second laser diode configured to emit a second linearly polarized laser beam extending along a second polarization axis that is perpendicular to the first polarization axis. A polarization combiner is configured to combine the first and second linearly polarizing laser beams into a combined laser beam, wherein the combined laser beam comprises one of: (1) circular polarization; and (2) elliptical polarization. A measuring device is configured to measure an intensity of the combined laser beam. A control unit is configured to receive the measured intensity of the combined laser beam and is further configured to adjust an intensity of at least one of: (1) the first laser diode; and (2) the second laser diode.

10 Claims, 2 Drawing Sheets

(56) References Cited

U.S. PATENT DOCUMENTS

| | | | |
|---|---|---|---|
| 2015/0167932 A1 | 6/2015 | Yamada et al. | |
| 2016/0087393 A1* | 3/2016 | Rapp | H01S 5/06832 |
| | | | 398/38 |
| 2019/0237939 A1* | 8/2019 | Barron-Jimenez | |
| | | | H01S 5/02253 |
| 2019/0310539 A1 | 10/2019 | Yamagishi et al. | |
| 2020/0159009 A1 | 5/2020 | Rueb | |

FOREIGN PATENT DOCUMENTS

| | | |
|---|---|---|
| DE | 102013208819 A1 | 11/2014 |
| DE | 102019217801 A1 | 5/2020 |
| DE | 112013004405 B4 | 10/2020 |

\* cited by examiner

LASER PROJECTOR WITH TWO LASER DIODES

CROSS REFERENCE TO RELATED INVENTION

This application is based upon and claims priority to, under relevant sections of 35 U.S.C. § 119, German Patent Application No. 10 2020 116 897.7, filed Jun. 26, 2020, the entire contents of which are hereby incorporated by reference.

FIELD OF TECHNOLOGY

The present disclosure relates to a device for laser projection comprising two laser diodes.

BACKGROUND

Laser projectors are used in a wide variety of technical fields for protecting outlines and markings on objects. Generally, their lines can be projected in a highly visible manner in a red, green or multi-color projection onto a flat or curved surface. Frequently CAD data which are processed into projection data and are transmitted to one or more projectors serve as a basis for the projection. Industrial laser projection systems generate virtual although visible templates that do not touch or soil the surfaces. Technically, the projection is carried out using one or more galvanometers that are each equipped with a mirror. The laser beam is deflected by the mirror, wherein the rotary angle of the mirror determines the direction of the deflection. If two or more galvanometers are combined with each other, any accessible point in space can be illuminated.

A laser projection system for projecting a laser image onto a work surface has been disclosed in DE 10 2019 217 801 A1 that provides optimized laser energy, wherein a laser source and an electronic circuit are provided to modulate an initial power level. A control unit contains a scanning path input module for generating a simulation of the angular velocity of the scanning mirror along the scanning path in order to be able to thereby estimate a concentration of the laser energy along the scanning path. The electronic circuit modulates an energy concentration of the laser beam depending on the laser energy and the angular velocity on the scanning mirror. This is so that a stable, non-fluttering image arises even at high speed.

A laser projector with two laser light sources has been disclosed in US 2019/0310539 A1. The laser sources are arranged opposite one other and are combined with each other by two reflectors.

A compact laser projector with two laser diodes has been disclosed in US 2019/0237939 A1. The two laser diodes are combined with each other in order to thereby approximately double the light strength of the laser. By means of two collimator lenses and a λ/2 plate, the two laser beams are brought together by a reflector. The particular advantage in this case is the compact design of a powerful laser.

A laser projection device and a laser projection method for projecting laser beams onto a projection plane has been disclosed in DE 10 2013 208 819 A1. In this case, a controllable multibeam laser diode apparatus is provided whose laser beams are deflected by means of deflecting apparatuses. The deflection apparatuses are actuated by a control apparatus such that the deflected laser beams move along a scanning line on the projection plane, wherein differently deflected laser beams run on the same scanning line as separate beams in the projection plane.

BRIEF SUMMARY OF THE INVENTION

The object of the invention is to provide a device for laser protection that provides the desired intensity of the laser beam using simple means. A device a for laser projection is described that is a laser projector or a laser projector system or part of a laser projection system.

In an embodiment, two laser diodes with the same wavelength are provided. The beams of the laser diodes are each polarized linearly, wherein the polarization axes or directions are perpendicular to each other in pairs. Furthermore, a polarization combiner is provided that combines the incident beams of the laser diodes into a combined beam with circular or elliptical polarization. This exploits the fact that the different polarizations of the incident beams can be combined into a circular or elliptical polarization. According to an embodiment, a measuring arrangement is furthermore provided that measures an intensity of the combined laser beam. The measured value of the measuring arrangement is therefore a measure of the intensity of the combined laser beam. The measured value of the intensity of the combined laser beam is preferably applied to a control unit as an input signal. The control unit adjusts an intensity of at least one of the light diodes. The adjustment can occur for example manually or depending on the applied input signal. This means that the device according to the invention combines two laser beams that are identical except for their polarization into a combined laser beam, and adjusts its intensity using the control unit. This gives rise to a series of important possible uses for the laser projector that result from the adaptation of the intensity.

In a preferred embodiment, the control unit is configured in one operating mode to increase the power of the at least one adjustable laser diode as the intensity of the combined beam attenuates. This operating mode ensures that if the power of one of the two laser diodes attenuates or completely fails, the intensity of the other laser diode is increased, and the intensity of the combined laser beam is thereby also increased. In the industrial use of the laser projector, this operating mode is particularly advantageous. If one of the laser diodes fails, for example, projection with the other laser diode can be continued without interrupting operation. This enables continuous work without interruption to exchange the laser diode.

In an embodiment, the intensity of the combined laser beam is regulated. Its intensity is regulated to a setpoint that for example can be specified as constant over time. Regulating the intensity creates a series of advantages for the practical use of the projector. Accordingly for example, a setpoint can be specified that lies a certain value below the permissible maximum value for reasons of safety. In this embodiment, the laser projector is operated at constant power.

In another embodiment, a second operating mode is provided that provides elevated or reduced power of the combined beam for parts and/or sections of a figure to be projected. The figure to be projected can be a coherent figure in which parts of the figure are for example visually emphasized or deemphasized by increasing or reducing the power of the combined laser beam. This can for example also help to display assembly steps in which for example parts or sections of the figure are emphasized stepwise and sequentially. Moreover, contours or contour sections to be projected in the second operating mode can be displayed differently.

This has an advantage for example when first a first contour and then a second contour are to be displayed for a certain process.

Preferably, a maximum permissible laser power is provided for the laser projector that is not exceeded for the combined laser beam by a control unit. Conventionally, a maximum permissible laser power can for example result solely from the configuration of the laser diode without further measures. In the use of two laser diodes that are combined with each other and therefore can work with different laser powers for the combined laser beam, it is therefore advantageous to specify the maximum permissible laser power.

Pulse width modulation can for example be provided to control the laser diodes. The pulse width modulation then dictates the output power of the laser diode. Alternatively or in combination with pulse width modulation, continuous controlling of the laser diode can be provided.

It has proven to be useful if an adjustable focusing apparatus is provided for each laser diode. The focusing apparatus is generally not used during the operation of the laser projector but is rather adjusted once initially at a distance from the projection surface.

To achieve particularly easy and effective alignment of the laser diodes with respect to the polarization combiner, each of the laser diodes is then mounted on a support plate that is attached to a common base support. Accordingly, the laser beams of the laser diodes can be aligned relative to each other by the separate support plates.

For improved alignment of the support plates relative to each other, a first support plate is equipped with or otherwise defines a slot that permits an alignment of the first plate relative to a second support plate. The second support plate is for example already securely mounted directly on the base support, and the first support plate is aligned relative to the second support plate by using the slot, and is also fastened to the base support for example by a screw.

An embodiment of a laser projector is configured to project using two galvanometer mirrors that can direct the combined laser beam in any direction. In an embodiment, the combined laser beam is redirected using two galvanometer mirrors. The rotary axes of the mirror preferably enclose a right angle. This yields an X/Y alignment of the laser beam that makes it possible to project contours, markings and the like with the laser light onto surfaces accessible to the laser beam.

BRIEF DESCRIPTION OF THE DRAWINGS

The invention will be further explained with reference to an exemplary embodiment. In the figures.

DETAILED DESCRIPTION OF THE INVENTION

Figure 1:
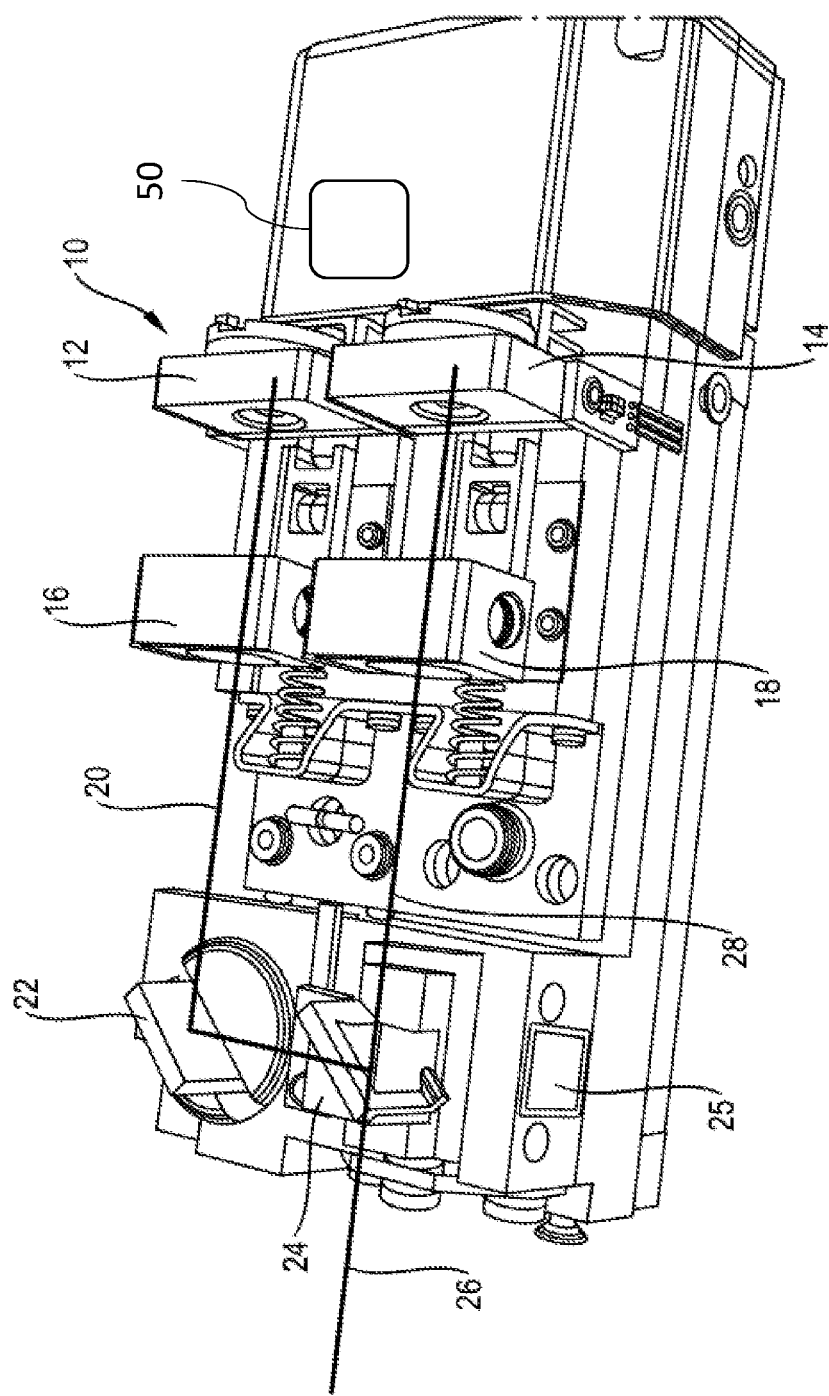
FIG. 1 illustrates a perspective view of an embodiment of two laser diodes that are combined into one superimposed beam.

FIG. 1 shows the configuration of a laser projector 10 with two laser diodes 12, 14. The laser beams of the laser diodes 12, 14 each pass through a focusing optical system 16, 18. The focusing optical system 16, 18 is adjusted at a distance from the projection surface. The laser beam 20 of the laser diode 12 strikes a mirror 22 and is redirected toward the polarization combiner 24. The laser beam 28 that has passed through the focusing unit 18 also strikes the polarization combiner 24 and also contributes to the combined laser beam 26. The measuring arrangement or measuring device 25 for the intensity of the combined laser beam is arranged at the height of the polarization combiner 24 and measures the "waste" light of the beam 20 that is not redirected toward the combined laser beam 26, and the redirected light of the beam 28 that is deflected in the polarization combiner 24. The measuring arrangement 25 can be a photodiode that is sensitive to the wavelength of the laser light.

Figure 2:
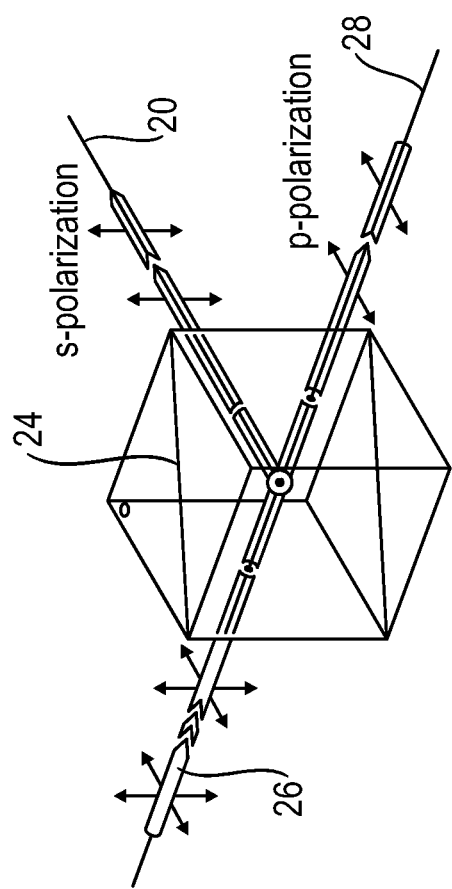
FIG. 2 schematically illustrates an embodiment of the principle of beam combination with polarization.

FIG. 2 shows the principle mode of operation of the polarization combiner 24. The incoming beam 20 is polarized linearly with a so-called s-polarization. The also incoming beam 28 also possesses a linear polarization with a p-polarization. S- and p-polarization are perpendicular to each other. The combined light beam 26 possesses a superimposed polarization that appears as a circular or elliptical polarization.

The polarization combiner is preferably equipped with a measuring apparatus that detects the intensity of the combined laser beam 26. The detected intensity is forwarded to a control unit 50 that is schematically depicted in FIG. 1. The control unit 50 controls the laser diodes 12 and 14. In this case, a distinction is to be made between different operating modes: Both laser diodes 12, 14 possess the same wavelength and can replace each other. If the laser projector is working with one of the laser diodes, for example the laser diode 14, and if its brightness for the projected figure attenuates, a manual switch can therefore be made to the control unit 50 for the other laser diode number 12. The control unit 50 executes the manual switchover in this embodiment. In an automated embodiment, the control unit 50 automatically switches to the other laser diode as the intensity of the combined laser beam attenuates, depending on the attached input signal. In this case, the user does not have to intervene, and the operation of the laser projector continues automatically.

The control unit 50 can be equipped with a second operating mode. The second operating mode does not necessarily exclude the first operating mode. The second operating mode makes it possible to increase the brightness of the projection in projection points and regions. To accomplish this, the intensity of the combined laser beam is increased. It is particularly advantageous in this context that a user who for example is being guided through the projection with respect to his work steps is thereby given the opportunity of emphasizing individual work steps in the context of the workflow. Moreover, other emphases can also emphasize individual contours more brightly, for example when projecting more than one contour. This increases the clarity when using the laser projector.

LIST OF REFERENCE SIGNS

10 Laser projector
12 Laser diode
14 Laser diode
16 Focusing optical system
18 Focusing optical system
20 Laser beam
22 Mirror
24 Polarization combiner
25 Measuring arrangement
26 Combined laser beam
28 Laser beam
50 Control unit

The invention claimed is:

1. A device for laser projection comprising:
   a base plate;
   a first support plate and a second support plate;
   a first laser diode mounted to the first support plate and configured to emit a first linearly polarized laser beam extending along a first polarization axis;
   a second laser diode mounted to the second support plate and configured to emit a second linearly polarized laser beam extending along a second polarization axis that is perpendicular to the first polarization axis, wherein the first support plate and the second support plate are coupled to the base plate, wherein the first and second laser diodes are configured with a same wavelength;
   a focusing optical system adjustably positioned relative to a projection surface, wherein the first and second linearly polarized laser beam each pass through the focusing optical system;
   a polarization combiner configured to combine the first and second linearly polarizing laser beams exiting the focusing optical system into a combined laser beam, wherein the combined laser beam comprises one of: (1) circular polarization; and (2) elliptical polarization;
   two galvanized mirrors configured to direct the combined laser beam in any direction;
   a measuring device configured to measure an intensity of the combined laser beam; and
   a control unit configured to receive the measured intensity of the combined laser beam and further configured to adjust an intensity of at least one of: (1) the first laser diode; and (2) the second laser diode.

2. The device according to claim 1, wherein the control unit is configured to adjust the intensity of the at least one of the first laser diode and the second laser diode in response to the received measured intensity of the combined laser beam.

3. The device according to claim 1, further comprising a first operating mode wherein the control unit is configured to increase power of the at least one of the first laser diode and the second laser diode as the intensity of the combined laser beam attenuates.

4. The device according to claim 1, wherein the control unit regulates the intensity of the combined laser beam to a setpoint.

5. The device according to claim 3, further comprising a second operating mode, wherein in the second operating mode the power of the combined laser beam is adjusted for sections of a figure to be projected.

6. The device according to claim 5, wherein the second operating mode is configured to display contours to be projected with differing brightness.

7. The device according to claim 1, wherein the control unit does not exceed a predetermined maximum permissible laser power.

8. The device according to claim 1, wherein the first and second laser diodes are configured to be controlled by pulse width modulation.

9. The device according to claim 1, wherein the first and second laser diodes are configured to be controlled by continuous controlling.

10. The device according to claim 1, wherein a first support plate defines a slot configured to enable alignment of the first support plate relative to the second support plate.

* * * * *